United States Patent
Neal et al.

(10) Patent No.: US 11,640,929 B2
(45) Date of Patent: May 2, 2023

(54) THERMAL MANAGEMENT SOLUTIONS FOR CORED SUBSTRATES

(71) Applicant: Intel Corporation, Santa Clara, CA (US)

(72) Inventors: Nicholas Neal, Gilbert, AZ (US); Divya Mani, Chandler, AZ (US); Nicholas Haehn, Scottsdale, AZ (US)

(73) Assignee: Intel Corporation, Santa Clara, CA (US)

( * ) Notice: Subject to any disclaimer, the term of this patent is extended or adjusted under 35 U.S.C. 154(b) by 986 days.

(21) Appl. No.: 16/227,201

(22) Filed: Dec. 20, 2018

(65) Prior Publication Data

US 2020/0203256 A1    Jun. 25, 2020

(51) Int. Cl.
| | |
|---|---|
| *H01L 23/00* | (2006.01) |
| *H01L 23/473* | (2006.01) |
| *H01L 23/498* | (2006.01) |
| *H01L 23/467* | (2006.01) |
| *H01L 21/48* | (2006.01) |

(52) U.S. Cl.
CPC .......... *H01L 23/473* (2013.01); *H01L 21/481* (2013.01); *H01L 21/4846* (2013.01); *H01L 21/4871* (2013.01); *H01L 23/467* (2013.01); *H01L 23/49827* (2013.01); *H01L 23/49838* (2013.01); *H01L 24/16* (2013.01); *H01L 2224/16227* (2013.01)

(58) Field of Classification Search
CPC ................. H01L 23/473; H01L 23/467; H01L 23/49827; H01L 23/49838
See application file for complete search history.

(56) References Cited

U.S. PATENT DOCUMENTS

| | | | |
|---|---|---|---|
| 9,935,035 B1* | 4/2018 | Buvid | .................... H01L 23/473 |
| 2011/0176280 A1* | 7/2011 | Lee | ........................... H05K 7/20 361/721 |
| 2011/0308791 A1* | 12/2011 | Overmeyer | ............. H01L 23/34 166/57 |

FOREIGN PATENT DOCUMENTS

WO    WO-2017052636 A1 *   3/2017   ........... H01L 21/486

\* cited by examiner

*Primary Examiner* — Reema Patel
(74) *Attorney, Agent, or Firm* — Essential Patents Group, LLP.

(57) ABSTRACT

An integrated circuit assembly may be formed having a substrate core, wherein the substrate core includes at least one heat transfer fluid channel formed therein, a first build-up layer formed on a first surface of the substrate core, and a second build-up layer formed on a second surface of the substrate core, and methods of fabricating the same. In embodiments of the present description, the integrated circuit structure may include at least one integrated circuit device formed within at least one of the first build-up layer and the second build-up layer. The embodiments of the present description allow for cooling within the substrate, which may significantly reduce thermal damage to the components of the substrate and/or integrated circuit devices within the substrate.

20 Claims, 9 Drawing Sheets

THERMAL MANAGEMENT SOLUTIONS FOR CORED SUBSTRATES

TECHNICAL FIELD

Embodiments of the present description generally relate to the removal of heat from integrated circuit packages, and, more particularly, to thermal management solutions for substrates, which are used to form the integrated circuit packages.

BACKGROUND

Higher performance, lower cost, increased miniaturization, and greater packaging density of integrated circuits within integrated circuit devices are ongoing goals of the electronics industry. As these goals are achieved, integrated circuit packages become smaller, which can make thermal management challenging.

These integrated circuit packages may have a variety of configurations. For example, the integrated circuit package may be a "flip chip" package, wherein integrated circuit devices are assembled on a surface of a substrate using interconnects, such as solder bumps or balls. In another example, the integrated circuit package may be an embedded package, wherein the integrated circuit devices (either active or passive) are embedded inside the substrate or a mold layer, and/or at least some of the package redistribution layers are formed directly over the integrated circuit device (e.g. the wafer level, the reconstituted wafer level, or the panel level). Regardless of the type of integrated circuit package, they can run at high temperatures due to embedded integrated circuit devices (active or passive) and/or to self-heating of the metallization (conductive traces and conductive vias) within the substrate from electrical resistance, particularly when high power devices are used in the integrated circuit packages. The high temperatures can cause thermal damage to the materials used to form the substrate, particularly when organic materials are used, which can degrade at temperatures above about 300 degrees Celsius or if kept at extended periods of time at temperatures between about 200 and 250 degrees Celsius. The high temperatures can also cause damage or destruction to integrated circuits within the embedded integrated circuit device (active or passive).

One option to mitigate damage to the materials used to form the substrate is to use ceramic materials rather than using organic materials. Ceramic materials can support considerably higher temperature without degradation. However, they are generally significantly more expensive compared to organic materials and, generally, result in lower density than organic materials, e.g. requiring more layers for the same number of conductive routes within the substrate, as will be understood to those skilled in the art.

Another option to mitigate this thermal issue is to use integrated circuit devices having thermal throttling control that are capable of reducing their operating frequency and, thus, their power in order to operate at a lower temperature and avoid failures. However, this results in a lower overall performance.

A further option is to use metal layers within the substrate for heat dissipation. However, this is generally not sufficiently efficient due to the thinness of the metal layers compared to a traditional heat dissipation device.

BRIEF DESCRIPTION OF THE DRAWINGS

The subject matter of the present disclosure is particularly pointed out and distinctly claimed in the concluding portion of the specification. The foregoing and other features of the present disclosure will become more fully apparent from the following description and appended claims, taken in conjunction with the accompanying drawings. It is understood that the accompanying drawings depict only several embodiments in accordance with the present disclosure and are, therefore, not to be considered limiting of its scope. The disclosure will be described with additional specificity and detail through use of the accompanying drawings, such that the advantages of the present disclosure can be more readily ascertained, in which:

DESCRIPTION OF EMBODIMENTS

Figure 1:
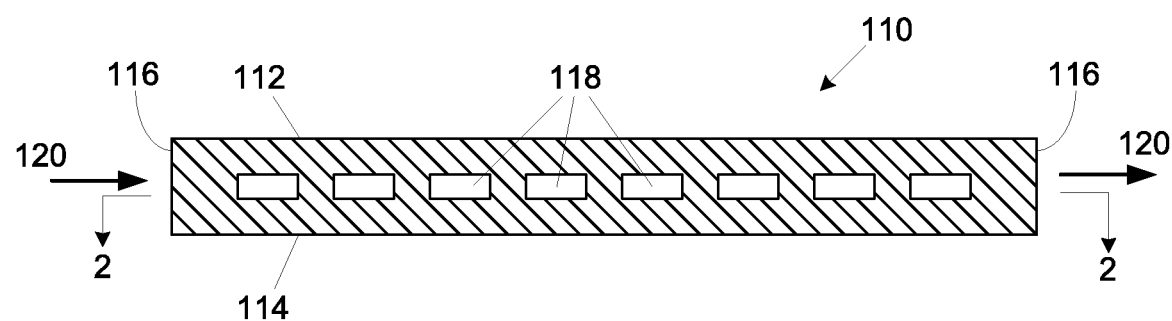
FIG. 1 is a side cross-sectional view of a substrate core having at least one heat transfer fluid channel formed therein, according to an embodiment of the present description.

In the following detailed description, reference is made to the accompanying drawings that show, by way of illustration, specific embodiments in which the claimed subject matter may be practiced. These embodiments are described in sufficient detail to enable those skilled in the art to practice the subject matter. It is to be understood that the various embodiments, although different, are not necessarily mutually exclusive. For example, a particular feature, structure, or characteristic described herein, in connection with one embodiment, may be implemented within other embodiments without departing from the spirit and scope of the claimed subject matter. References within this specification to "one embodiment" or "an embodiment" mean that a particular feature, structure, or characteristic described in connection with the embodiment is included in at least one implementation encompassed within the present invention. Therefore, the use of the phrase "one embodiment" or "in an embodiment" does not necessarily refer to the same embodiment. In addition, it is to be understood that the location or arrangement of individual elements within each disclosed embodiment may be modified without departing from the spirit and scope of the claimed subject matter. The following detailed description is, therefore, not to be taken in a limiting sense, and the scope of the subject matter is defined only by the appended claims, appropriately interpreted, along with the full range of equivalents to which the appended claims are entitled. In the drawings, like numerals refer to the same or similar elements or functionality throughout the several views, and that elements depicted therein are not necessarily to scale with one another, rather individual elements may be enlarged or reduced in order to more easily comprehend the elements in the context of the present description.

The terms "over", "to", "between" and "on" as used herein may refer to a relative position of one layer with respect to other layers. One layer "over" or "on" another layer or bonded "to" another layer may be directly in contact with the other layer or may have one or more intervening layers. One layer "between" layers may be directly in contact with the layers or may have one or more intervening layers.

The term "package" generally refers to a self-contained carrier of one or more dice, where the dice are attached to the package substrate, and may be encapsulated for protection, with integrated or wire-boned interconnects between the dice and leads, pins or bumps located on the external portions of the package substrate. The package may contain a single die, or multiple dice, providing a specific function. The package is usually mounted on a printed circuit board for interconnection with other packaged integrated circuits and discrete components, forming a larger circuit.

Here, the term "cored" generally refers to a substrate of an integrated circuit package built upon a board, card or wafer comprising a non-flexible stiff material. Typically, a small printed circuit board is used as a core, upon which integrated circuit device and discrete passive components may be soldered. Typically, the core has vias extending from one side to the other, allowing circuitry on one side of the core to be coupled directly to circuitry on the opposite side of the core. The core may also serve as a platform for building up layers of conductors and dielectric materials.

Here, the term "coreless" generally refers to a substrate of an integrated circuit package having no core. The lack of a core allows for higher-density package architectures, as the through-vias have relatively large dimensions and pitch compared to high-density interconnects.

Here, the term "land side", if used herein, generally refers to the side of the substrate of the integrated circuit package closest to the plane of attachment to a printed circuit board, motherboard, or other package. This is in contrast to the term "die side", which is the side of the substrate of the integrated circuit package to which the die or dice are attached.

Here, the term "dielectric" generally refers to any number of non-electrically conductive materials that make up the structure of a package substrate. For purposes of this disclosure, dielectric material may be incorporated into an integrated circuit package as layers of laminate film or as a resin molded over integrated circuit dice mounted on the substrate.

Here, the term "metallization" generally refers to metal layers formed over and through the dielectric material of the package substrate. The metal layers are generally patterned to form metal structures such as traces and bond pads. The metallization of a package substrate may be confined to a single layer or in multiple layers separated by layers of dielectric.

Here, the term "bond pad" generally refers to metallization structures that terminate integrated traces and vias in integrated circuit packages and dies. The term "solder pad" may be occasionally substituted for "bond pad" and carries the same meaning.

Here, the term "solder bump" generally refers to a solder layer formed on a bond pad. The solder layer typically has a round shape, hence the term "solder bump".

Here, the term "substrate" generally refers to a planar platform comprising dielectric and metallization structures. The substrate mechanically supports and electrically couples one or more IC dies on a single platform, with encapsulation of the one or more IC dies by a moldable dielectric material. The substrate generally comprises solder bumps as bonding interconnects on both sides. One side of the substrate, generally referred to as the "die side", comprises solder bumps for chip or die bonding. The opposite side of the substrate, generally referred to as the "land side", comprises solder bumps for bonding the package to a printed circuit board.

Here, the term "assembly" generally refers to a grouping of parts into a single functional unit. The parts may be separate and are mechanically assembled into a functional unit, where the parts may be removable. In another instance, the parts may be permanently bonded together. In some instances, the parts are integrated together.

Throughout the specification, and in the claims, the term "connected" means a direct connection, such as electrical, mechanical, or magnetic connection between the things that are connected, without any intermediary devices.

The term "coupled" means a direct or indirect connection, such as a direct electrical, mechanical, magnetic or fluidic connection between the things that are connected or an indirect connection, through one or more passive or active intermediary devices.

The term "circuit" or "module" may refer to one or more passive and/or active components that are arranged to cooperate with one another to provide a desired function. The term "signal" may refer to at least one current signal, voltage signal, magnetic signal, or data/clock signal. The meaning of "a," "an," and "the" include plural references. The meaning of "in" includes "in" and "on."

The vertical orientation is in the z-direction and it is understood that recitations of "top", "bottom", "above" and "below" refer to relative positions in the z-dimension with the usual meaning. However, it is understood that embodiments are not necessarily limited to the orientations or configurations illustrated in the figure.

The terms "substantially," "close," "approximately," "near," and "about," generally refer to being within +/−10% of a target value (unless specifically specified). Unless otherwise specified the use of the ordinal adjectives "first," "second," and "third," etc., to describe a common object, merely indicate that different instances of like objects to which are being referred and are not intended to imply that the objects so described must be in a given sequence, either temporally, spatially, in ranking or in any other manner.

For the purposes of the present disclosure, phrases "A and/or B" and "A or B" mean (A), (B), or (A and B). For the purposes of the present disclosure, the phrase "A, B, and/or C" means (A), (B), (C), (A and B), (A and C), (B and C), or (A, B and C).

Views labeled "cross-sectional", "profile" and "plan" correspond to orthogonal planes within a cartesian coordinate system. Thus, cross-sectional and profile views are taken in the x-z plane, and plan views are taken in the x-y plane. Typically, profile views in the x-z plane are cross-sectional views. Where appropriate, drawings are labeled with axes to indicate the orientation of the figure.

Embodiments of the present description may include an integrated circuit assembly having a substrate core, wherein the substrate core includes at least one heat transfer fluid channel formed therein, a first build-up layer formed on a first surface of the substrate core and a second build-up layer formed on a second surface of the substrate core, and methods of fabricating the same. In embodiments of the present description, the integrated circuit structure may include at least one integrated circuit device formed within at least one of the first build-up layer and the second build-up layer. The embodiments of the present description allow for cooling within the substrate, which may significantly reduce thermal damage to the components of the substrate and/or integrated circuit devices within the substrate.

FIG. 1 illustrates a substrate core 110 having a first surface 112, an opposing second surface 114, at least one sidewall 116 extending between the first surface 112 and the second surface 114, and at least one heat transfer fluid channel 118 formed within the substrate core 110. In one embodiment, as shown in FIG. 1, the heat transfer fluid channels 118 of the substrate core 110 may be designed to allow a heat transfer fluid (illustrated as arrows 120) to enter (arrow 120 on left side of FIG. 1) and an exit (arrow on right side of FIG. 1) along the at least one sidewall 116 of the substrate core 110. The substrate core 110 may be any appropriate substantially rigid material, including, but not limited to, fire retardant grade 4 material, glass reinforced epoxy matrix material, glass, ceramics, and the like.

The heat transfer fluid 120 may be any appropriate gas or liquid, or a combination thereof. In one embodiment, the heat transfer fluid 120 may comprise air. In another embodiment, the heat transfer fluid 120 may comprise water. In still another embodiment, the heat transfer fluid 120 may comprise a dielectric refrigerant. In a further embodiment, the heat transfer fluid 120 may comprise an oil. In other embodiments, the heat transfer fluid 120 may be comprised of two phases (such as liquid water and water vapor, or liquid-phase and gas-phase dielectric refrigerant) that exist simultaneously in one or more regions of the heat transfer fluid channel(s) 118.

Figure 2:
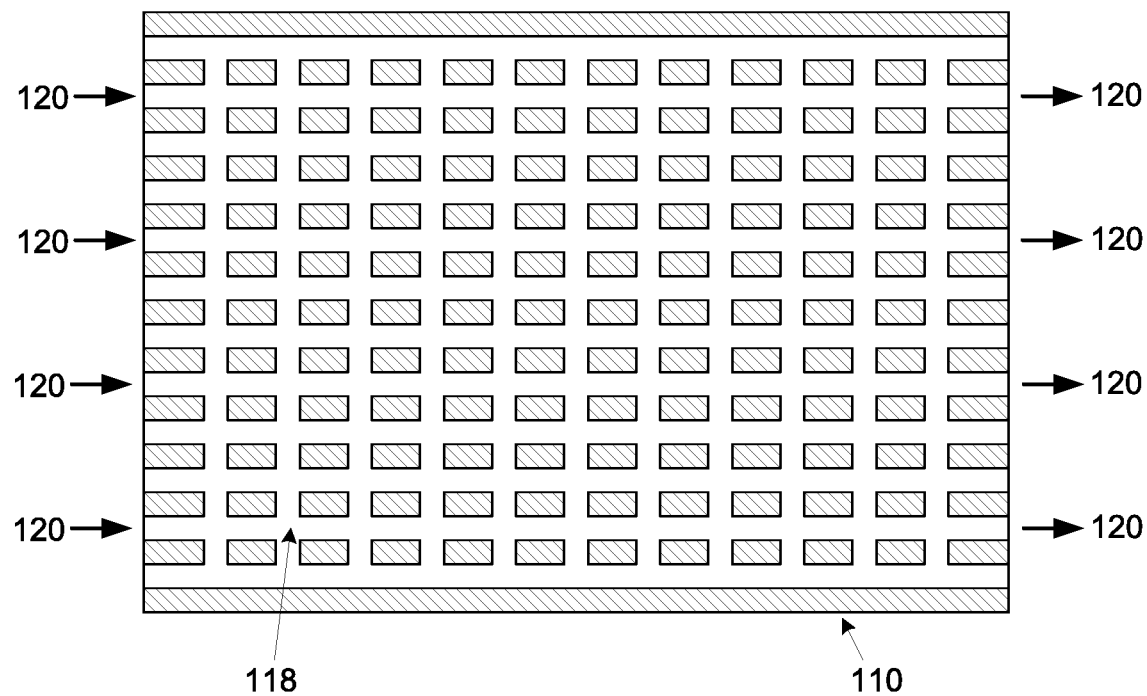
FIGS. 2 and 3 are cross-sectional views of the heat dissipation fluid channels of the core of the substrate along line 2-2 of FIG. 1, according to embodiments of the present description.
Figure 3:
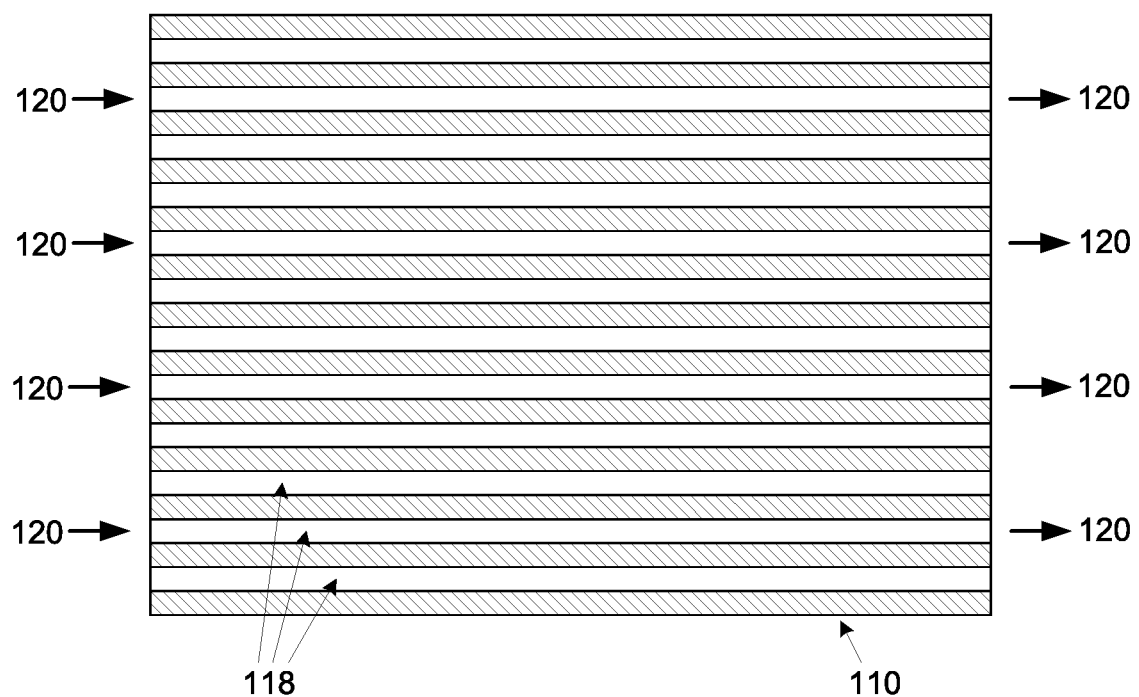

The heat transfer fluid channel(s) 118 may have any appropriate configuration to facilitate heat removal. In one embodiment, shown in FIG. 2, which is a view along line 2-2 of FIG. 1, the heat transfer fluid channel 118 may be a single structure, which, in general, directs the heat transfer fluid 120 linearly (illustrated left to right). In another embodiment, shown in FIG. 3, the substrate core 110 may have a plurality of heat transfer fluid channels that are substantially aligned in parallel.

Figure 4:
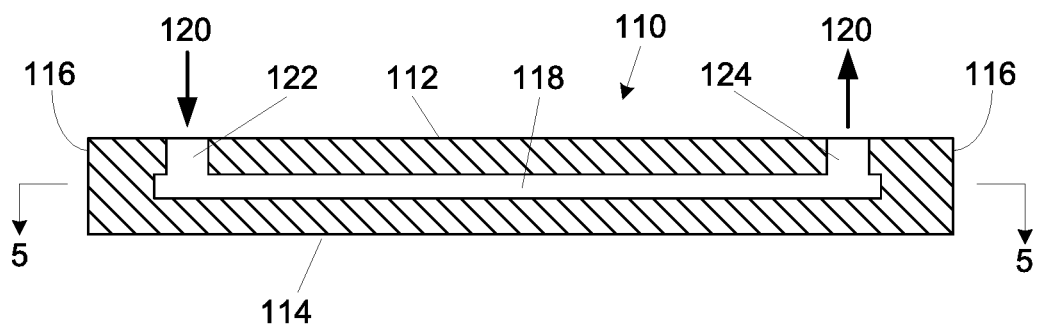
FIG. 4 is a side cross-sectional view of a substrate core having at least one heat transfer fluid channel formed therein wherein an inlet port and an outlet port extend from a first surface of the substrate core, according to an embodiment of the present description.
Figure 5:
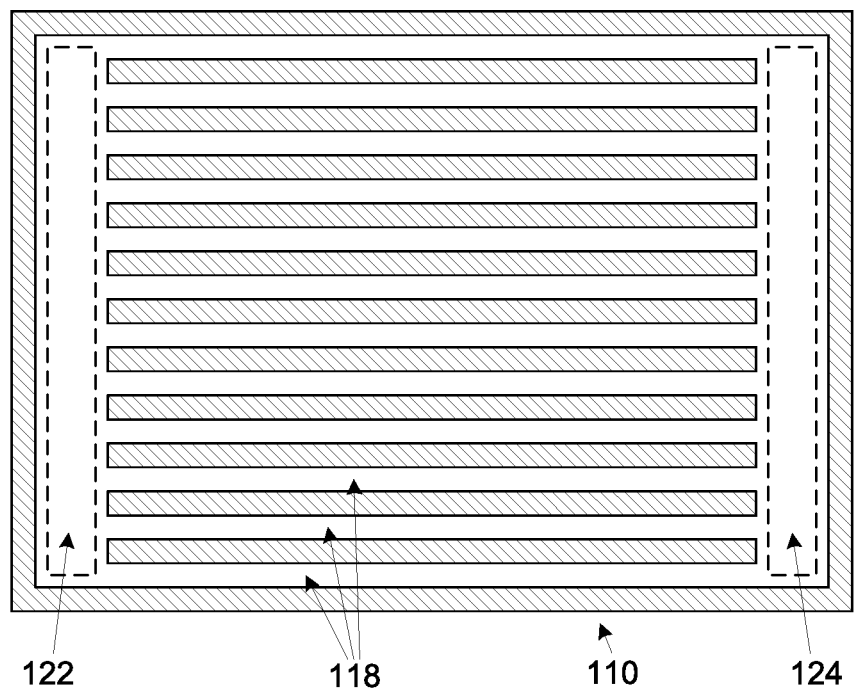
FIG. 5 is a cross-sectional view of the heat dissipation fluid channels of the core of the substrate along line 5-5 of FIG. 5, according to embodiments of the present description.

In one embodiment of the present description, shown in FIGS. 4 and 5, the heat transfer fluid channels 118 of the substrate core 110 may be designed to allow the heat transfer fluid 120) to enter through an inlet port 122 extending from the first surface 112 of the substrate core 110 and an exit through an outlet port 124 extending from the first surface 112 of the substrate core 110.

Figure 6:
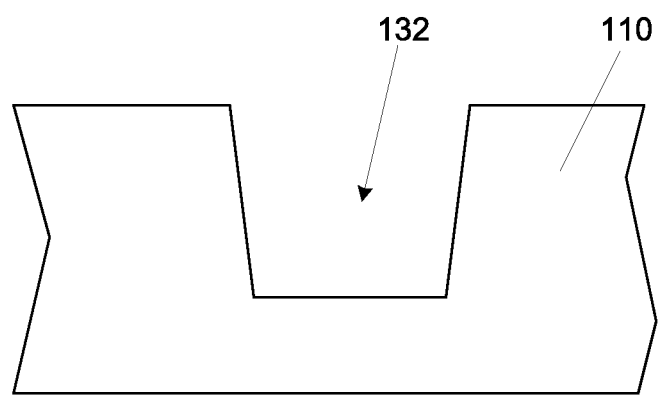
FIGS. 6-9 are side cross-sectional views of a method of forming a heat dissipation channel in a substrate core, according to an embodiment of the present description.
Figure 7:
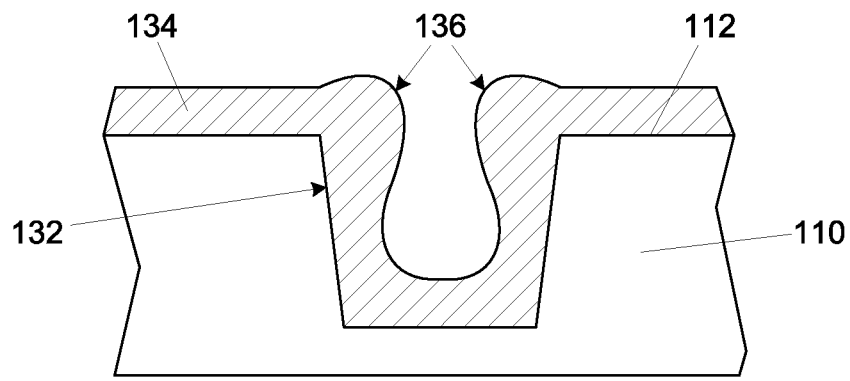
Figure 8:
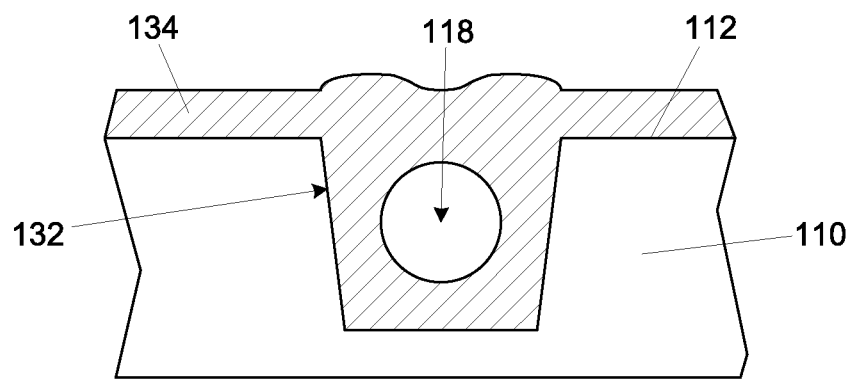
Figure 9:
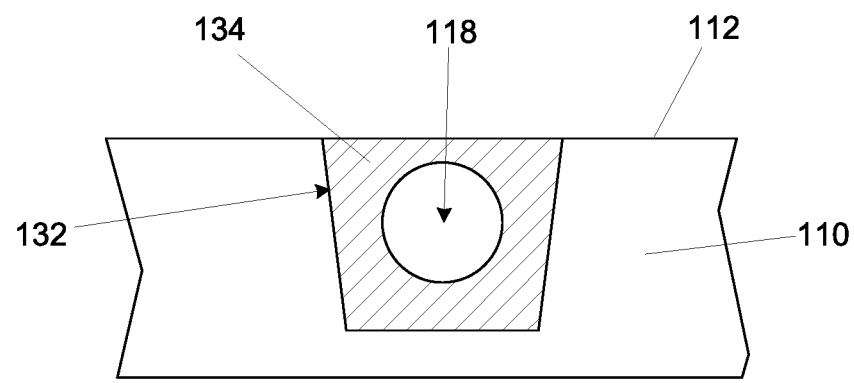

In one embodiment, as shown in FIGS. 6-9, the heat transfer fluid channels 118 may be formed in a "defect" mode. As shown in FIG. 6, a trench 132 may be formed in the substrate core 110 extending from the first surface 112 thereof, such as by etching, laser ablation, ion bombardment, and the like. A metal layer 134, such as copper, aluminum, alloys thereof, and the line, may then be formed, such as by plating, over the first surface 112 of the substrate core 110 and into the trench 132. It is understood, that a seed layer, as known in the art, may be deposited over the first surface 112 of the substrate core 110 and into the trench 132 prior to the formation of the metal layer 134. As the metal layer 134 is formed, an overhang 136 forms at the first surface 112 of the substrate core 110, as shown in the FIG. 7. As the formation of the metal layer 134 continues, the overhang 136 (see FIG. 7) seals the trench 132 to form a void which becomes the heat transfer fluid channel 118, as shown in FIG. 8. This void is generally considered a defect when trying to fill a trench, such as the trench 132; however, in this process, the defect is used advantageously to form the heat transfer fluid channel 118. As shown in FIG. 9, the metal layer 134 may be planarized, such as by chemical mechanical polishing (CMP) to expose the first surface 112 of the substrate core 110.

Figure 10:
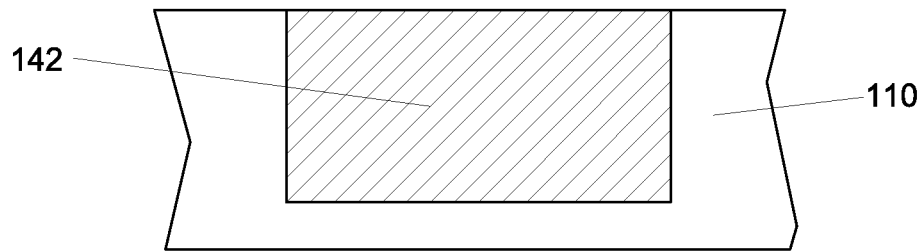
FIGS. 10-14 are side cross-sectional views of a method of forming a heat dissipation channel in a substrate core, according to another embodiment of the present description.
Figure 11:
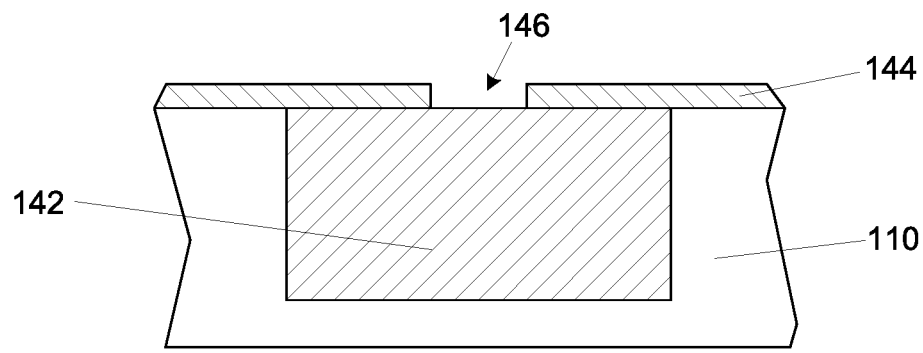
Figure 12:
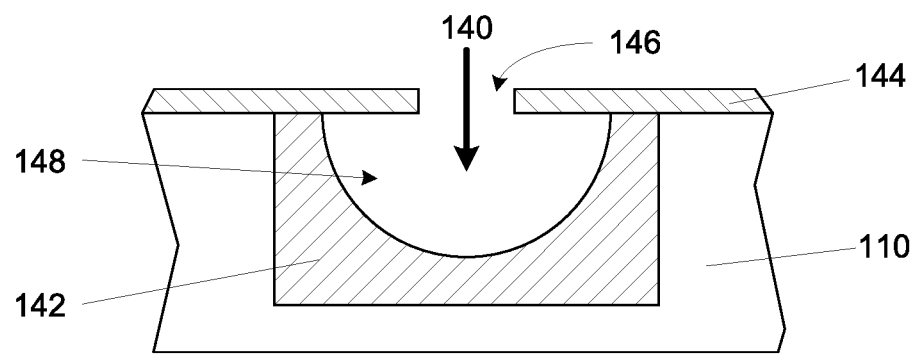
Figure 13:
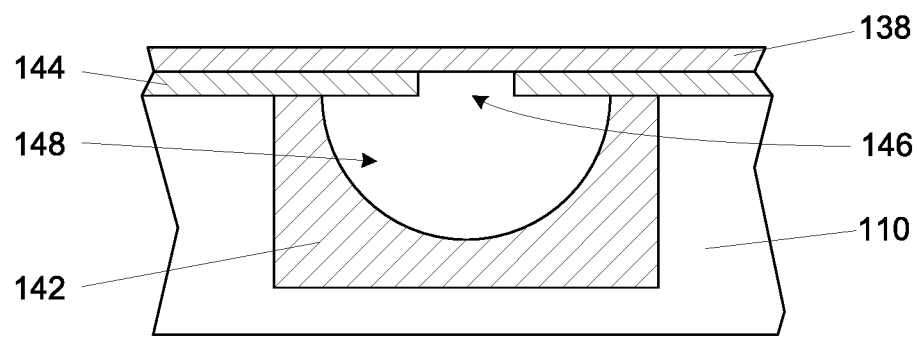
Figure 14:
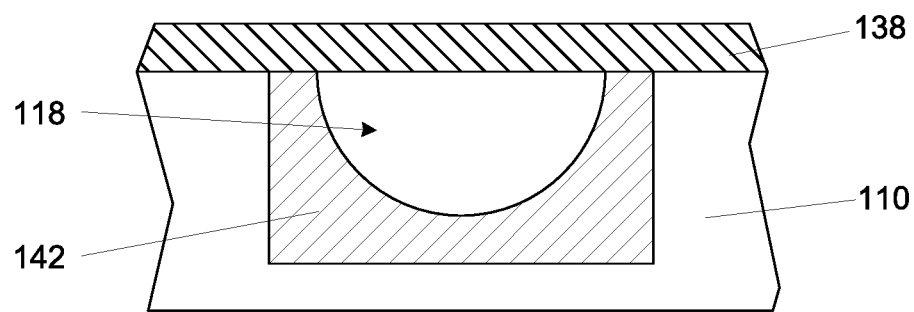

In another embodiment, as shown in FIGS. 10-14, the heat transfer fluid channels 118 may be formed by etching. As shown in FIG. 10, a metal block 142, such as copper, aluminum, alloys thereof, and the line, may be formed as a part of the substrate core 110. An etch mask 144, such as a layer of nickel, may be formed over the substrate core 110 and the metal block 142 with an opening 146 patterned over the metal block 142, as shown in FIG. 11. As shown in FIG. 12, the metal block 142 may be isotropically etched (shown as arrow 140), such that the etch undercuts the etch mask 144 to form a cavity 148, which becomes the heat transfer fluid channel 118 (see FIG. 1). If there is a potential of the subsequent processing materials (not shown) entering the cavity 148, a capping layer 138 may be formed over the etch mask 144 to seal the opening 146 in the etch mask 144. In one embodiment, the capping layer 138 may be a metal plated on the etch mask 144. As discussed with regard to the embodiment of FIGS. 6-9, the plated metal layer may form an overhang (not shown) which seals over the opening 146 of the etch mask 136. In another embodiment, as shown in FIG. 14, the etch mask 144 may be removed and the capping layer 138 may be formed over the substrate core 110, the metal block 142, and the cavity 148 to form the heat transfer fluid channel 118. In one embodiment of FIG. 14, the capping layer 138 may be laminated over the substrate core 110, the metal block 142, and the cavity 148.

Figure 15:
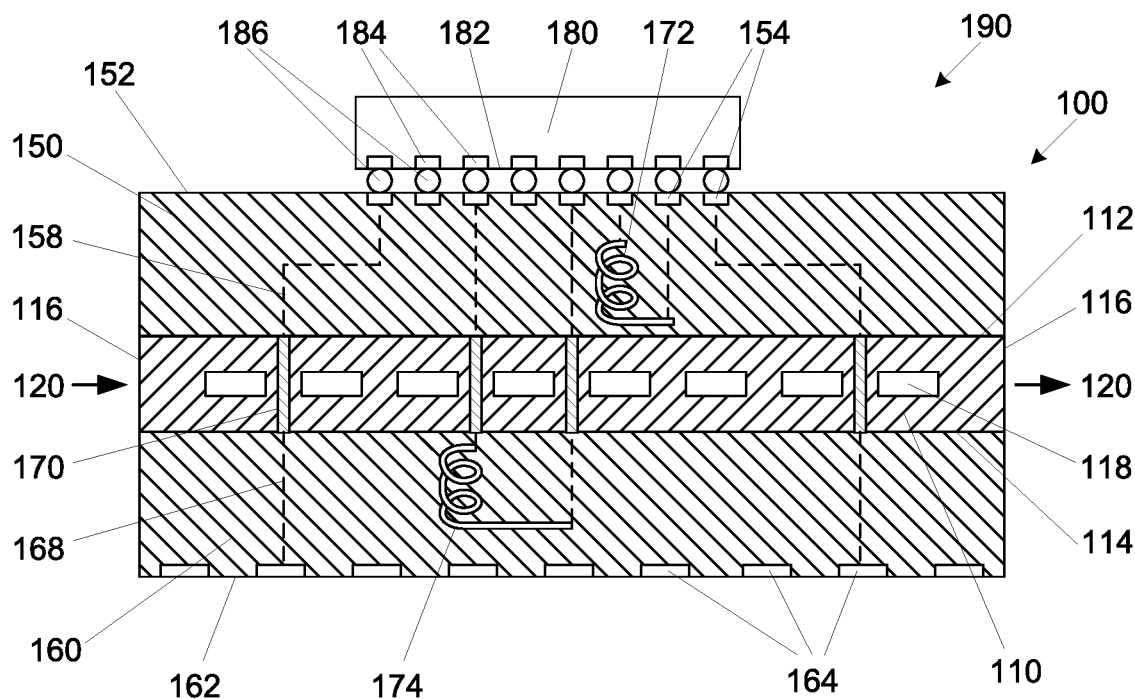
FIG. 15 is a side cross-sectional view of an integrated circuit structure having heat dissipation channels formed in the core of a substrate, wherein a heat transfer fluid may be introduced and removed through a first build-up layer of the substrate, according to an embodiment of the present description.
Figure 16:
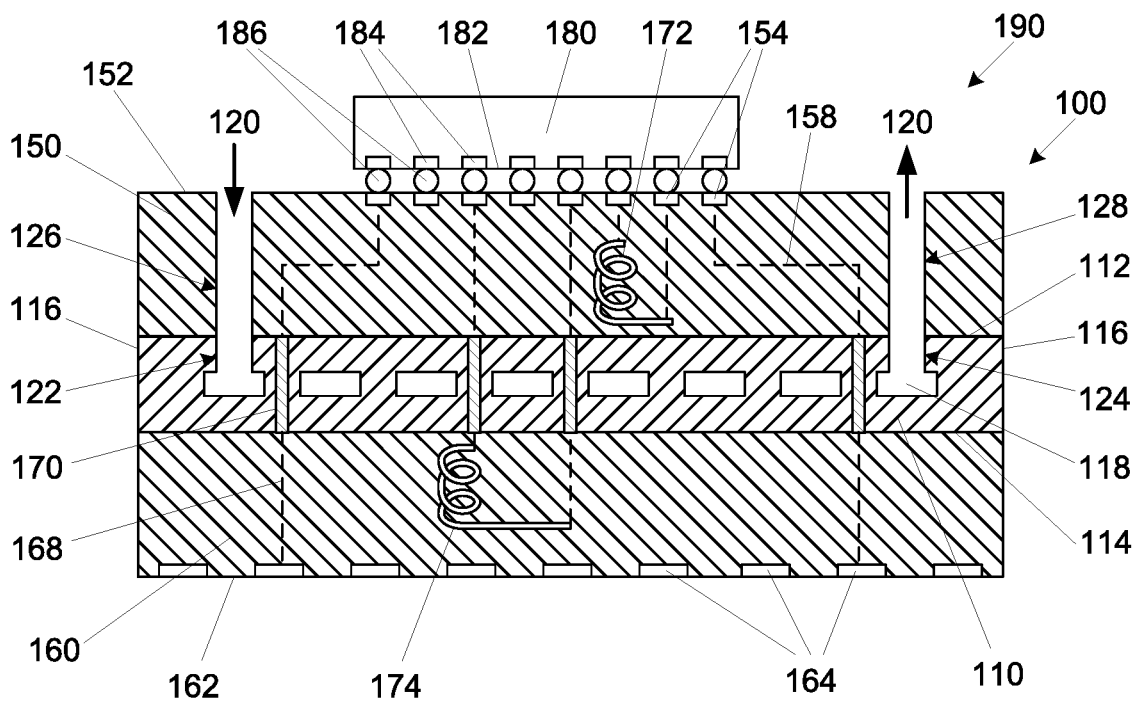
FIG. 16 is a side cross-sectional view of an integrated circuit structure having a heat dissipation channels formed in the core of a substrate, wherein a heat transfer fluid may be introduced and removed through a second build-up layer of the substrate, according to an embodiment of the present description.

As shown in FIGS. 15 and 16, the substrate core 110 of FIG. 1 and FIG. 4, respectively, may be incorporated into a substrate 100. As shown in FIG. 15, a first build-up layer 150 may be formed adjacent the first surface 112 of the substrate core 110, and a second build-up layer 160 may be formed adjacent the second surface 114 of the substrate core 110 to form the substrate 100. The first build-up layer 150 may comprise a plurality of dielectric layers (not shown) with a plurality of conductive routes 158 (shown as dashed lines) extending through the first build-layer 150. The conductive routes 158 of the first build-up layer 150 may be comprise a plurality of conductive traces (not shown) formed on the plurality of dielectric layers (not shown) with a plurality of conductive vias (not shown) extending through respective dielectric layers (not shown) to electrically connect the plurality of conductive traces (not shown). Likewise, the second build-up layer 160 may comprise a plurality of dielectric layers (not shown) with a plurality of conductive routes 168 (shown as dashed lines) extending through the second build-up layer 160. The conductive routes 168 of the second build-up layer 160 maybe comprise a plurality of conductive traces (not shown) formed on the plurality of dielectric layers (not shown) with a plurality of conductive vias (not shown) extending through respective dielectric layers (not shown) to electrically connect the plurality of conductive traces (not shown). As shown in FIG. 15, at least one of the conductive routes 158 of the first build-up layer 150 and at least one of the conductive routes 168 of the second build-up layer 160 may be electrically connected to one another with an electrical connector 170, such as a plated through-hole, extending from the first surface 112 of the substrate core 110 to the second surface 114 of the substrate core 110, which allows for electrical signals to be transmitted through the substrate core 110. The conductive routes 158 of the first build-up layer 150 and the conductive routes 158 of the second build-up layer 160 may be referred to herein as "metallization". The processes for layering the dielectric material layers and forming the conductive routes 158, 168 for the first build-up layer 150 and the second build-up layer 160, respectively, as well as the processes for forming the electrical connector 170, are well known in the art and for purposes of brevity and conciseness will not be described herein.

The substrate 100 may be any appropriate structure, including, but not limited to, an interposer, a printed circuit board, a motherboard, and the like. The dielectric material layers (not shown) of the substrate 100 may include build-up films and/or solder resist layers, and may be composed of an appropriate dielectric material, including, but not limited to, bismaleimide triazine resin, polyimide materials, silica filled epoxy, and the like, as well as laminates or multiple layers thereof. The conductive routes 158 and 168 may be composed of any conductive material, including but not limited to metals, such as copper, aluminum, and alloys thereof.

In one embodiment of the present description, an integrated circuit device 180 may be electrically attached to the substrate 100 with a plurality of interconnects 186, to form an integrated circuit assembly, such as an integrated circuit package 190. In one embodiment, the interconnects 186 may extend between bond pads 184 on a first surface 182 of the integrated circuit device 180, which are in electrical communication with integrated circuitry (not shown) within the integrated circuit device 180, and bond pads 154 on a first surface 152 of the first build-up layer 150 of the substrate 100, which are in contact with the conductive routes 158. As will be understood to those skilled in the art, the substrate 100 may reroute a fine pitch (center-to-center distance between the bond pads) of the bond pads 184 of the integrated circuit device 180 to a relatively wider pitch of bond pads 164 on a first surface 162 of the second build-up layer 160 of the substrate 100. It is further understood that the bond pads 164 may be connected through interconnects (not shown) to a motherboard or other external components (not shown).

The integrated circuit device 180 may be any appropriate device, including, but not limited to a microprocessor, a chipset, a graphics device, a wireless device, a memory device, an application specific integrated circuit, combinations thereof, stacks thereof, or the like. The interconnects 186 may be any appropriate electrically conductive material, including, but not limited to metal filled epoxies and solders, such as tin, lead/tin alloys (for example, 63% tin/37% lead solder), and high tin content alloys (e.g. 90% or more tin—such as tin/bismuth, eutectic tin/silver, ternary tin/silver/copper, eutectic tin/copper, and similar alloys).

The substrate 100 may include embedded components that generate significant heat, such as an inductor, shown as a first inductor 172 and a second inductor 174, formed in at least one of the first build-up layer 150 and the second build-up layer 160. Inductors are passive two-terminal electrical devices that store energy in a magnetic field when electrical current flows through it and are used to store an electrical charge. Inductors are generally a portion of a voltage regulator circuit, which precisely controls the voltage and current of integrated circuit devices, such as the integrated circuit device 180. In one embodiment, the first inductor 172 may be electrically attached to the integrated circuit device 180 through respective conductive routes 158 of the first build-up layer 150. In an embodiment of the present description, the second inductor 174 may be electrically attached to the integrated circuit device 180 through respective conductive routes 168 of the second build-up layer 160, electrical connectors 170, and conductive routes 158 of the first build-up layer 150. In one embodiment of the present description, at least one of the first inductor 172 and the second inductor 174 may be formed separately and embedded in the substrate 100. In another embodiment of the present description, at least one of the first inductor 172 and the second inductor 174 may be formed as a part of the substrate 100 during the fabrication thereof using the conductive traces (not shown) and conductive vias (not shown). In a further embodiment of the present description, at least one of the first inductor 172 and the second inductor 174 may be an air coil inductor, as known in the art.

As shown in FIG. 16, the substrate core 110 of FIG. 4, may be incorporated into the substrate 100 in a manner described with regard to the embodiment of FIG. 15. As shown in FIG. 16, the substrate 100 may include a first heat transfer fluid conduit 126, which may extend from the first surface 152 of the first build-up layer 150 to the inlet port 122 of the substrate core 110, and a second heat transfer fluid conduit 128, which may extend from the outlet port 124 of the substrate core 110 to the first surface 152 of the first build-up layer 150. The heat transfer fluid 120 (illustrated generically as a down arrow (left side) and an up arrow (right side)), which may be used to remove heat from the substrate 100, may flow into the at least one heat transfer fluid channel 118 from the first heat transfer conduit 126 and out of the at least one heat transfer fluid channel 118 through the second heat transfer conduit 128.

Although FIGS. 15 and 16 illustrate a single integrated circuit device 180, the embodiments of the present description are not so limited, as the integrated circuit package 190 may have a plurality of integrated circuit devices. In further embodiments of the present description, integrated circuit devices may be embedded in the substrate 100 in the first build-up layer 150 and/or the second build-up layer 160.

Figure 17:
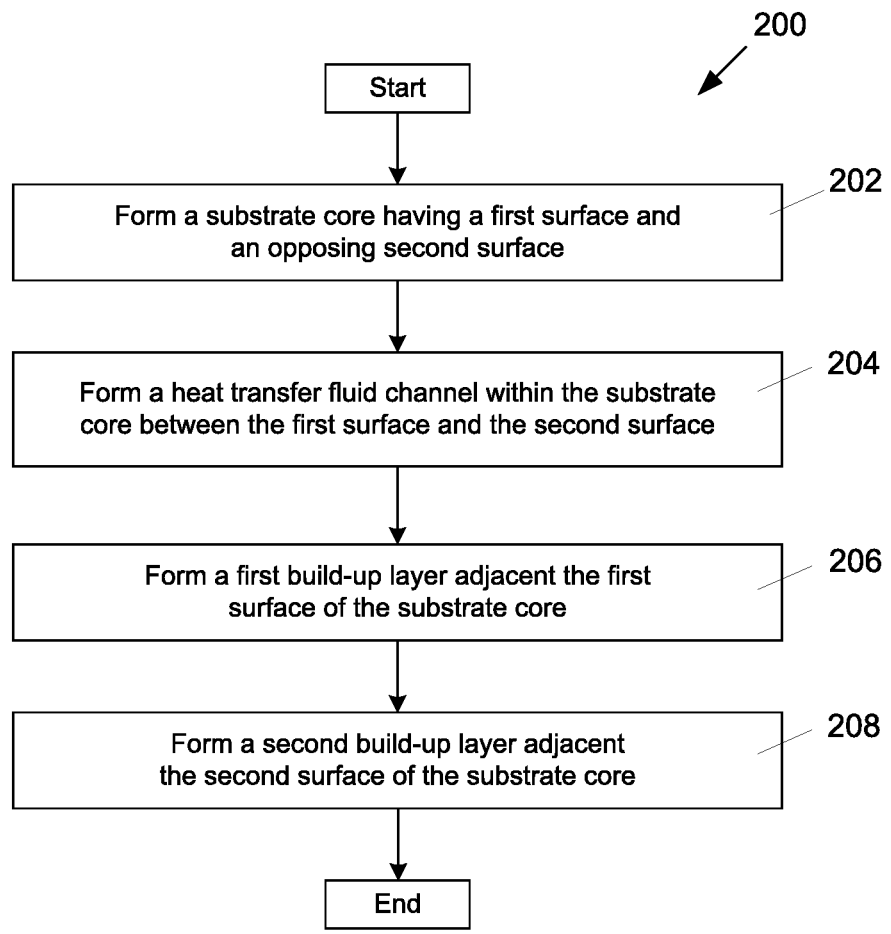
FIG. 17 is a flow diagram of a method for fabricating an integrated circuit structure, according to one embodiment of the present description.

FIG. 17 is a flow chart of a process 200 of fabricating an integrated circuit assembly according to an embodiment of the present description. As set forth in block 202, a substrate core may be formed having a first surface and an opposing second surface. At least one heat transfer fluid channel may be formed within the substrate core between the first surface and the second surface, as set forth in block 204. As set forth in block 206, a first build-up layer may be formed adjacent the first surface of the substrate core. A second build-up layer may be formed adjacent the second surface of the substrate core, as set forth in block 208.

Figure 18:
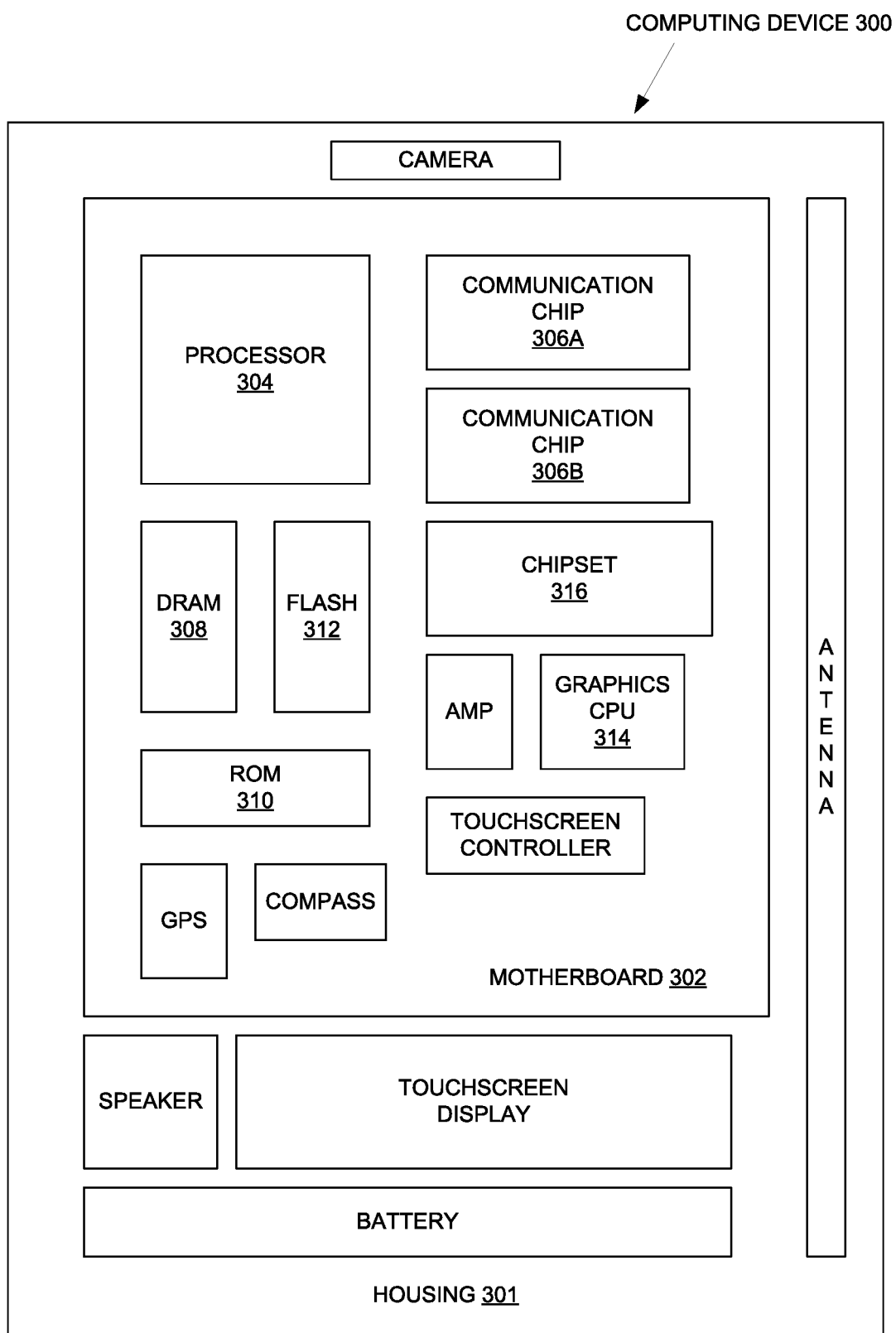
FIG. 18 is an electronic device/system, according to an embodiment of the present description.

FIG. 18 illustrates an electronic or computing device 300 in accordance with one implementation of the present description. The computing device 300 may include a housing 301 having a board 302 disposed therein. The board 302 may include a number of integrated circuit components, including but not limited to a processor 304, at least one communication chip 306A, 306B, volatile memory 308 (e.g., DRAM), non-volatile memory 310 (e.g., ROM), flash memory 312, a graphics processor or CPU 314, a digital signal processor (not shown), a crypto processor (not shown), a chipset 316, an antenna, a display (touchscreen display), a touchscreen controller, a battery, an audio codec (not shown), a video codec (not shown), a power amplifier (AMP), a global positioning system (GPS) device, a compass, an accelerometer (not shown), a gyroscope (not shown), a speaker, a camera, and a mass storage device (not shown) (such as hard disk drive, compact disk (CD), digital versatile disk (DVD), and so forth). Any of the integrated circuit components may be physically and electrically coupled to the board 302. In some implementations, at least one of the integrated circuit components may be a part of the processor 304.

The communication chip enables wireless communications for the transfer of data to and from the computing device. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device may include a plurality of communication chips. For instance, a first communication chip may be dedicated to shorter range wireless communications such as Wi-Fi and Bluetooth and a second communication chip may be dedicated to longer range wireless communications such as GPS, EDGE, GPRS, CDMA, WiMAX, LTE, Ev-DO, and others.

The term "processor" may refer to any device or portion of a device that processes electronic data from registers and/or memory to transform that electronic data into other electronic data that may be stored in registers and/or memory.

At least one of the integrated circuit components may include an integrated circuit assembly, comprising a substrate core having a first surface and an opposing second surface, at least one heat transfer fluid channel within the substrate core between the first surface and the second surface, a first build-up layer adjacent the first surface of the substrate core, and a second build-up layer adjacent the second surface of the substrate core.

In various implementations, the computing device may be a laptop, a netbook, a notebook, an ultrabook, a smartphone, a tablet, a personal digital assistant (PDA), an ultra-mobile PC, a mobile phone, a desktop computer, a server, a printer, a scanner, a monitor, a set-top box, an entertainment control unit, a digital camera, a portable music player, or a digital video recorder. In further implementations, the computing device may be any other electronic device that processes data.

It is understood that the subject matter of the present description is not necessarily limited to specific applications illustrated in FIGS. 1-18. The subject matter may be applied to other integrated circuit devices and assembly applications, as well as any appropriate electronic application, as will be understood to those skilled in the art.

Having thus described in detail embodiments of the present invention, it is understood that the invention defined by the appended claims is not to be limited by particular details set forth in the above description, as many apparent variations thereof are possible without departing from the spirit or scope thereof.

What is claimed is:

1. An integrated circuit assembly, comprising:
   a substrate core having a first surface and an opposing second surface;
   at least one heat transfer fluid channel within the substrate core between the first surface and the second surface, wherein the heat transfer fluid channel comprises a cavity, the cavity within a metal block and covered by a metal capping layer, wherein the metal block is at least partially within a trench in the substrate core;
   a first build-up layer adjacent the first surface of the substrate core; and
   a second build-up layer adjacent the second surface of the substrate core.

2. The integrated circuit assembly of claim 1, further comprising at least one integrated circuit device electrically connected to at least one of the first build-up layer or the second build-up layer.

3. The integrated circuit assembly of claim 1, further comprising at least one integrated circuit device embedded within at least one of the first build-up layer or the second build-up layer.

4. The integrated circuit assembly of claim 1, wherein the substrate core further comprises at least one inlet port and at least one outlet port, wherein the at least one heat transfer fluid channel extends between the at least one inlet port and the at least one outlet port.

5. The integrated circuit assembly of claim 4, further comprising a first heat transfer fluid conduit extending from one of the inlet port or the outlet port to a surface of the first build-up layer opposite the first surface of the substrate core.

6. The integrated circuit assembly of claim 1, wherein, in a plane orthogonal to fluid flow within the heat transfer fluid channel, the heat transfer fluid channel comprises a cross-sectional shape having a rounded edge.

7. The integrated circuit assembly of claim 1, further comprising an etch mask between the metal capping layer and the metal block.

8. The integrated circuit assembly of claim 1, wherein the metal capping layer is directly on the metal block.

9. The integrated circuit assembly of claim 1, wherein the metal block comprises one of copper or aluminum.

10. The integrated circuit assembly of claim 1, further comprising at least one electrical connector extending between the first surface of the substrate core and the second surface of the substrate core.

11. A system, comprising:
    a board; and
    an integrated circuit package electrically attached to the board, wherein the integrated circuit package comprises:
       a substrate core having a first surface and an opposing second surface;
       at least one heat transfer fluid channel within the substrate core between the first surface and the second surface, wherein the heat transfer fluid channel comprises a cavity, the cavity within a metal block and covered by a metal capping layer, wherein the metal block is at least partially within a trench in the substrate core;

a first build-up layer adjacent the first surface of the substrate core; and a second build-up layer adjacent the second surface of the substrate core.

12. The system of claim 11, further comprising at least one integrated circuit device electrically connected to at least one of the first build-up layer or the second build-up layer.

13. The system of claim 11, further comprising at least one integrated circuit device embedded within at least one of the first build-up layer or the second build-up layer.

14. The system of claim 11, wherein the substrate core further comprises at least one inlet port and at least one outlet port, wherein the at least one heat transfer fluid channel extends between the at least one inlet port and the at least one outlet port.

15. The system of claim 14, further comprising a first heat transfer fluid conduit extending from one of the inlet port or the outlet port to a surface of the first build-up layer opposite the first surface of the substrate core.

16. The system of claim 11, wherein, in a plane orthogonal to fluid flow within the heat transfer fluid channel, the heat transfer fluid channel comprises a cross-sectional shape having a rounded edge.

17. The system of claim 11, further comprising an etch mask between the metal capping layer and the metal block.

18. The system of claim 11, wherein the metal capping layer is directly on the metal block.

19. The system of claim 11, wherein the metal block comprises one of copper or aluminum.

20. The system of claim 11, further comprising at least one electrical connector extending between the first surface of the substrate core and the second surface of the substrate core.

* * * * *